United States Patent
Ayotte et al.

(10) Patent No.: US 9,508,680 B1
(45) Date of Patent: Nov. 29, 2016

(54) INDUCTION HEATING FOR UNDERFILL REMOVAL AND CHIP REWORK

(71) Applicant: GLOBALFOUNDRIES INC., Grand Cayman (KY)

(72) Inventors: Stephen P. Ayotte, Bristol, VT (US); Glen E. Richard, Burlington, VT (US); Timothy M. Sullivan, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/741,757

(22) Filed: Jun. 17, 2015

(51) Int. Cl.
H01L 23/00 (2006.01)
C09K 5/06 (2006.01)
H01L 21/56 (2006.01)

(52) U.S. Cl.
CPC ............. H01L 24/98 (2013.01); C09K 5/06 (2013.01); *H01L 21/563* (2013.01); *H01L 2924/186* (2013.01)

(58) Field of Classification Search
None
See application file for complete search history.

(56) References Cited

U.S. PATENT DOCUMENTS

| | | | |
|---|---|---|---|
| 5,558,795 A | 9/1996 | Frank | |
| 6,372,544 B1 | 4/2002 | Halderman | |
| 7,161,122 B2 | 1/2007 | DeBonis | |
| 7,575,955 B2 | 8/2009 | Attarwala | |
| 7,880,124 B2 | 2/2011 | DeBonis | |
| 8,009,442 B2 | 8/2011 | Lehman et al. | |
| 8,436,255 B2 | 5/2013 | Goh | |
| 2004/0110010 A1 | 6/2004 | Buchwalter et al. | |
| 2004/0155364 A1 | 8/2004 | Doba | |
| 2005/0171301 A1 | 8/2005 | Doba | |
| 2005/0250248 A1 | 11/2005 | Buchwalter et al. | |
| 2005/0284863 A1* | 12/2005 | DeBonis | H05B 6/105 219/635 |
| 2006/0014924 A1 | 1/2006 | Hanley et al. | |
| 2007/0084856 A1 | 4/2007 | DeBonis | |
| 2009/0170247 A1 | 7/2009 | Shekhawat | |
| 2012/0220080 A1 | 8/2012 | Watanabe | |
| 2012/0249375 A1* | 10/2012 | Heino | C08J 3/24 343/700 MS |
| 2012/0261064 A1 | 10/2012 | Boday | |
| 2016/0141085 A1* | 5/2016 | Heino | C08J 3/24 427/487 |

FOREIGN PATENT DOCUMENTS

DE    WO2013182591 A2    12/2013

* cited by examiner

*Primary Examiner* — Lex Malsawma
(74) *Attorney, Agent, or Firm* — Thompson Hine LLP; Anthony Canale

(57) ABSTRACT

Underfill materials and methods for removing an underfill material from beneath a chip in relation to removal of the chip from a substrate. The underfill material may a plurality of particles dispersed in a bulk matrix. The material constituting the particles may be capable of generating heat energy when exposed to a time-varying magnetic field. The bulk matrix of the underfill material between the chip and a substrate may be heated with heat energy transferred from the particles. While heated, the underfill material is removed. The heating of the underfill material may also be used to heat solder bumps connecting the chip with the substrate so that the solder bumps are liquefied.

16 Claims, 3 Drawing Sheets

INDUCTION HEATING FOR UNDERFILL REMOVAL AND CHIP REWORK

BACKGROUND

The invention relates generally to semiconductor packaging and, in particular, to underfill materials and methods for removing an underfill material from beneath a chip in relation to removal of the chip from a substrate.

A die or chip includes integrated circuits formed by front-end-of-line processing using the semiconductor material of a wafer, a local interconnect level formed by middle-of-line processing, and stacked metallization levels of an interconnect structure formed by back-end-of-line processing. After the wafer is diced, each chip may be joined with a substrate using, for example, a controlled collapse chip connection or flip chip process. In a flip chip process, reflowed solder bumps establish mechanical and electrical connections between pads in the top metallization level of the interconnect structure and a complementary set of pads on the substrate. The solder bumps can be formed on the pads of the chip using any number of techniques, including electroplating, evaporation, printing, and direct placement. Reflow of the solder bumps establishes solder joints that physically and electrically connect the chip pads with the substrate pads.

Underfill may be applied to fill open space beneath the chip that remains between the solder joints. After curing, the underfill may function to protect the solder joints against various adverse environmental factors and redistribute mechanical stresses arising from shock. The underfill may also prevent the solder joints from shearing during thermal cycles. Coefficient of thermal expansion (CTE) mismatch between the chip and the substrate can cause mechanical stresses as temperature changes are experienced that can lead to solder joint shearing and reliability issues.

Improved underfill materials and methods for removing an underfill material from beneath a chip in relation to removal of the chip from a substrate are needed that improve on existing underfill materials and such removal methods.

SUMMARY

In an embodiment of the invention, a method is provided for removing an underfill material from beneath a chip. The underfill material is heated by induction heating. While the underfill material is heated, the underfill material is removed from beneath the chip.

In an embodiment of the invention, a method is provided for reworking a chip. An underfill material between the chip and a substrate is heated by induction heating. Solder bumps coupling a plurality of first pads on the chip with a plurality of second pads on the substrate are also heated. While the underfill material and the solder bumps are heated, the chip is removed from the substrate.

In an embodiment of the invention, an underfill material includes a plurality of particles dispersed in a bulk matrix. A material constituting the particles is configured to generate heat energy by induction heating when exposed to a time-varying magnetic field.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
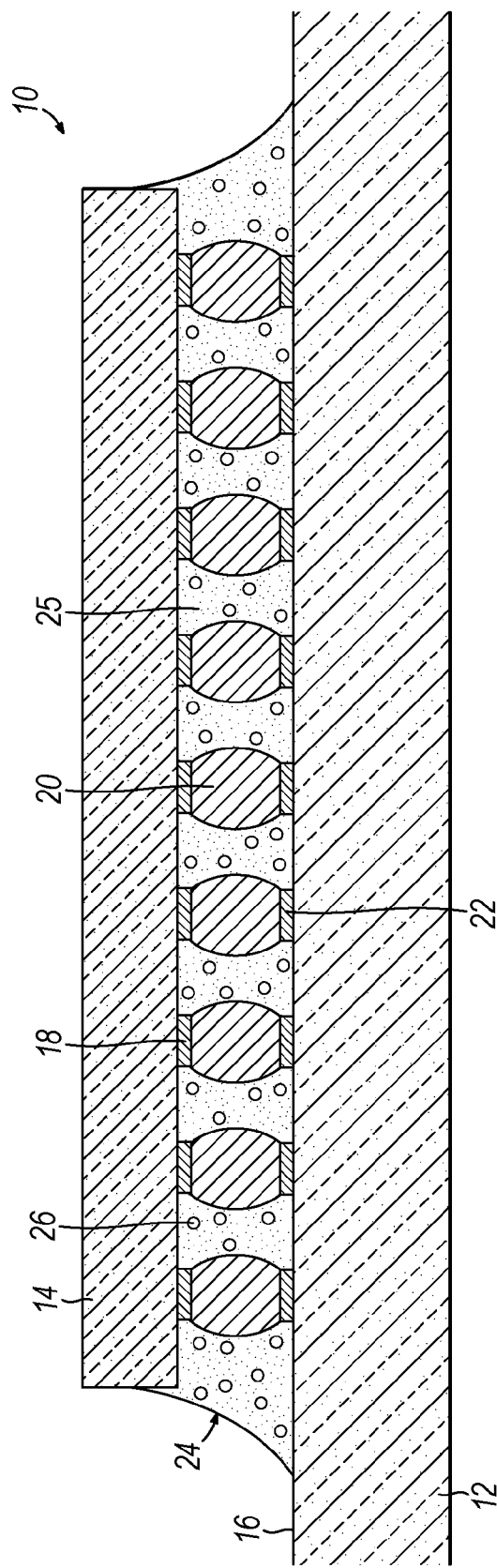
FIG. 1 is a side view of a chip mounted to a substrate by an array of solder balls and with underfill material in a space between the chip and the substrate.

With reference to FIG. 1, an assembly 10 includes a substrate 12 and a chip 14 that is mounted to a surface 16 of the substrate 12. The chip 14 includes a plurality of pads 18 formed in a topmost metallization level of the interconnect structure and solder bumps 20 that are formed on, or placed onto, the pads 18. The solder bumps 20 are configured to be reflowed to attach the chip 14 to the substrate 12. In particular, each solder bump 20 mechanically attaches one of the chip pads 18 with one of a plurality of pads 22 on the substrate 12 in a rigid connection. In additional to the mechanical attachment, the solder bumps 20 and pads 18, 22 provide electrical pathways for transferring signals between the integrated circuit(s) of the chip 14 and an external device, and also provide electrical pathways for powering and grounding the integrated circuit(s) of the chip 14.

The solder bumps 20 may be separately formed and transferred to the chip pads 18 by a controlled collapse chip connection (C4) technology. Alternatively, each solder bump may be formed on its chip pad 18 by electroplating using an appropriate plating solution, an anode, a cathode, and a direct current supplied to the anode/cathode while in the plating solution. The solder bumps 20 may be comprised of solder having a lead-free (Pb-free) composition, a eutectic tin/lead (Sn/Pb) composition, a high lead (Pb) composition, etc. An assembly including the chip 14, substrate 12, and the solder bumps 20 may be heated in a reflow oven to melt the solder in the bumps 20. Upon solidification, the solder bumps 20 have respective metallurgical bonds with the pads 18, 22.

The substrate 12 may be comprised of an organic material, such as a polymer or plastic, and the organic material may optionally be reinforced with, for example, glass fibers. Alternatively, the substrate 12 may be comprised of an inorganic material, such as a ceramic. The pads 18, 22 may be comprised primarily of aluminum (Al) or copper (Cu), and may further include one or more layers of other materials, such as titanium tungsten (TiW), nickel (Ni), etc., comprising under-bump metallurgy (UBM).

Underfill material 24 may be introduced beneath the chip 14 into the space between the chip 14 and substrate 12 that is not occupied by the solder bumps 20. The underfill process may entail applying the underfill material 24 as a fluid to the substrate 12 adjacent to the perimeter of the chip 14 and allowing capillary action to draw the underfill material 24 from the perimeter into the space between the chip 14 and the substrate 12. When hardened by curing, the underfill material 24 forms a strongly-bonded, cohesive mass. Among other effects, the underfill material 24 protects the solder bumps 20 against various adverse environmental factors, redistributes mechanical stresses due to shock, and prevents the solder joints from shearing under strain experienced during thermal cycles due to CTE mismatch.

The underfill material 24 may comprise a bulk matrix 25 comprised of, for example, a thermoplastic material that is an electrical insulator and non-conductive. The bulk matrix 25 of the underfill material 24 may include one or more polymerizable monomers, polyurethane prepolymers, block copolymers, and radial copolymers, as well as substances like initiators, catalysts, cross-linking agents, stabilizers, etc. After the underfill material 24 is located beneath the chip 14, the bulk matrix 25 of the underfill material 24 is cured and hardened. For example, thermoplastic materials may contain polymer molecules that can be chained or cross-linked by heat, ultraviolet light, or another type of electromagnetic energy to form a strongly bonded and cohesive mass.

The underfill material 24 may further include a plurality of particles 26 that are comprised of a material that is capable of coupling with a time-varying magnetic field to induce eddy currents and/or magnetic hysteresis losses in the particles 26 and to thereby cause induction heating by one or the other, or both, mechanisms. The particles 26 are dispersed or distributed in the bulk matrix 25 to form a composite material made from multiple constituent materials. The particles 26 are configured to respond by generating heat energy when exposed to a time-varying magnetic field by induction heating due to eddy currents and/or magnetic hysteresis losses, and with an associated temperature rise as the heat energy is generated. The bulk matrix 25 and any filler therein are not electrically conductive and, therefore, do not heat or otherwise generate heat energy in response to a time-varying magnetic field. The time variation of the magnetic field induces eddy currents eddy currents and/or magnetic hysteresis losses by electromagnetic induction in the material constituting the particles 26. Due to the electrical resistance of an electrically-conducting material, eddy currents generate heat energy by Joule heating. The temperature of the particles 26 rises and heat energy flows outward from the particles 26 by thermal conduction into the surrounding cured bulk matrix 25 comprising the underfill material 24. The heating rate of the particles 26 may be dependent, among other factors, on the frequency of the induced currents, the intensity of the induced currents, the specific heat of the constituent material, the magnetic permeability of the material, and the electrical resistance of the material to the flow of current.

In an embodiment, the particles 26 may be comprised of a ferriceramic material, such as a ferrimagnetic material like hematite ($Fe_2O_3$), magnetite ($Fe_3O_4$), or a ferrite ($MFe_2O_4$, where M is a divalent ion such as nickel, zinc, cadmium, manganese, or magnesium). Ferriceramic materials are electrical insulators characterized by a low electrical conductivity, yet heat when exposed to a time-varying magnetic field due to magnetic hysteresis losses. Alternatively, if the end use of the assembly 10 is tolerant to the addition of particles 26 that are electrically conductive to the underfill material 24 such that the dielectric properties of the bulk matrix 25 are reduced, the particles 26 may be comprised of a ferromagnetic material, such as iron, nickel, cobalt, or an alloy of these materials, that heat when exposed to a magnetic field due to eddy currents and/or magnetic hysteresis losses. Incidental to the ability to heat the bulk matrix 25 of the underfill material 24 with heat energy transferred from the particles 26 when immersed in a time-varying magnetic field, the particles 26 may function to improve the mechanical properties of the cured underfill material 24. The particles 26 may be spherical or near spherical in shape, and may have a diameter or a distribution of diameters in the range of 1 micron to 10 microns. Alternatively, the particles 26 may be characterized by other shapes and sizes so long as the particles 26 have smaller dimensions than the solder bumps 20.

Heat energy from the distributed heat sources represented by the heated particles 26 is transferred by thermal conduction to the surrounding bulk matrix 25 of the underfill material 24. The transferred heat energy causes the temperature of the surrounding bulk matrix 25 to rise from room or ambient temperature to an elevated temperature that is greater than room or ambient temperature. In an embodiment, the heating of the underfill material 24 may be sufficient to produce an elevated temperature that induces a phase transition of the cured bulk matrix 25 of the underfill material 24 from a solid phase to a liquid phase or a semisolid state. As used herein, a semisolid state is characterized by a consistency and/or viscosity intermediate between the solid phase and the liquid phase of a material, and may also result as an outcome when the cured bulk matrix 25 is liquefied.

The induction heating of the assembly 10 is selective in that the underfill material 24 experiences a far greater temperature rise than ether the chip 14 or the substrate 12. A benefit of the selective heating, among other benefits, is that the thermal aging of the substrate 12 may be reduced in comparison with a rework process that melts the underfill material 24 by heating the entire assembly 10, for example, in a reflow oven or with a forced flow of heated air. While the underfill material 24 is in the liquid phase or the semisolid state, the underfill material 24 may be removed from the space between the chip 14 and substrate 12, for example, by suction or by a forced flow of heated or room temperature air. The solder bumps 20 may be liquefied in a subsequent heating process in order to facilitate the release of the chip 14 from the substrate 12. In this embodiment, the removal of the underfill material 24 and the liquefaction of the solder bumps 20 occur during the performance of different heating processes.

In another embodiment and in addition to increasing the temperature of the cured bulk matrix 25 of the underfill material 24, the heating of the underfill material 24 may also be sufficient to cause the solder bumps 20 to experience a phase transition from a solid phase to a liquid phase or a semisolid state because of an increase in the temperature of solder bumps 20. In order to be liquefied, the solder bumps 20 do not have to be comprised of a specially engineered solder material because the electromagnetic properties of the particles 26 dispersed in the bulk matrix 25 couple with the time-varying magnetic field to provide the heat source. The chip 14 may be removed from the substrate by, for example, a spider rework in which the substrate 12 and chip 14 are inverted with a weight attached to the chip 14. When the solder bumps 20 and underfill material 24 are both liquefied, gravitational forces assist in causing the chip 14 to be released from the substrate 12. In this embodiment, the removal of the underfill material 24 and the liquefaction of the solder bumps 20 occur during the performance of the same heating process.

The underfill material 24 may further include small particles of a filler material comprised of an electrical insulator, such as glass or silica, and dispersed in the bulk matrix 25 in addition to the particles 26. Such optional filler particles may function to further improve the mechanical properties of the cured underfill material 24, but do not heat when exposed to a time-varying magnetic field.

Figure 2:
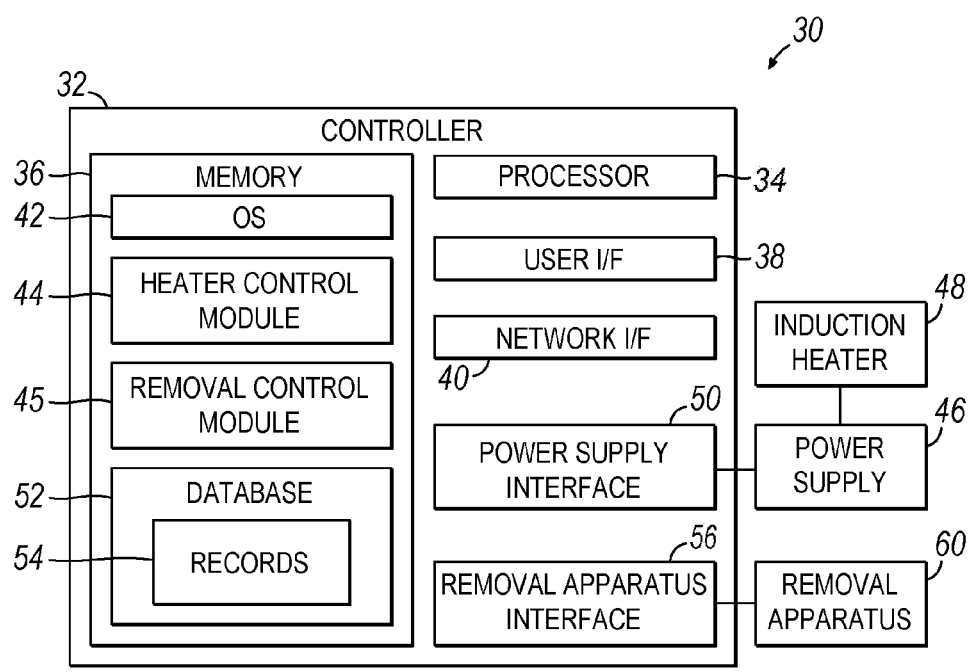
FIG. 2 is a diagrammatic view of a system in accordance with an embodiment of the invention.
Figure 3:
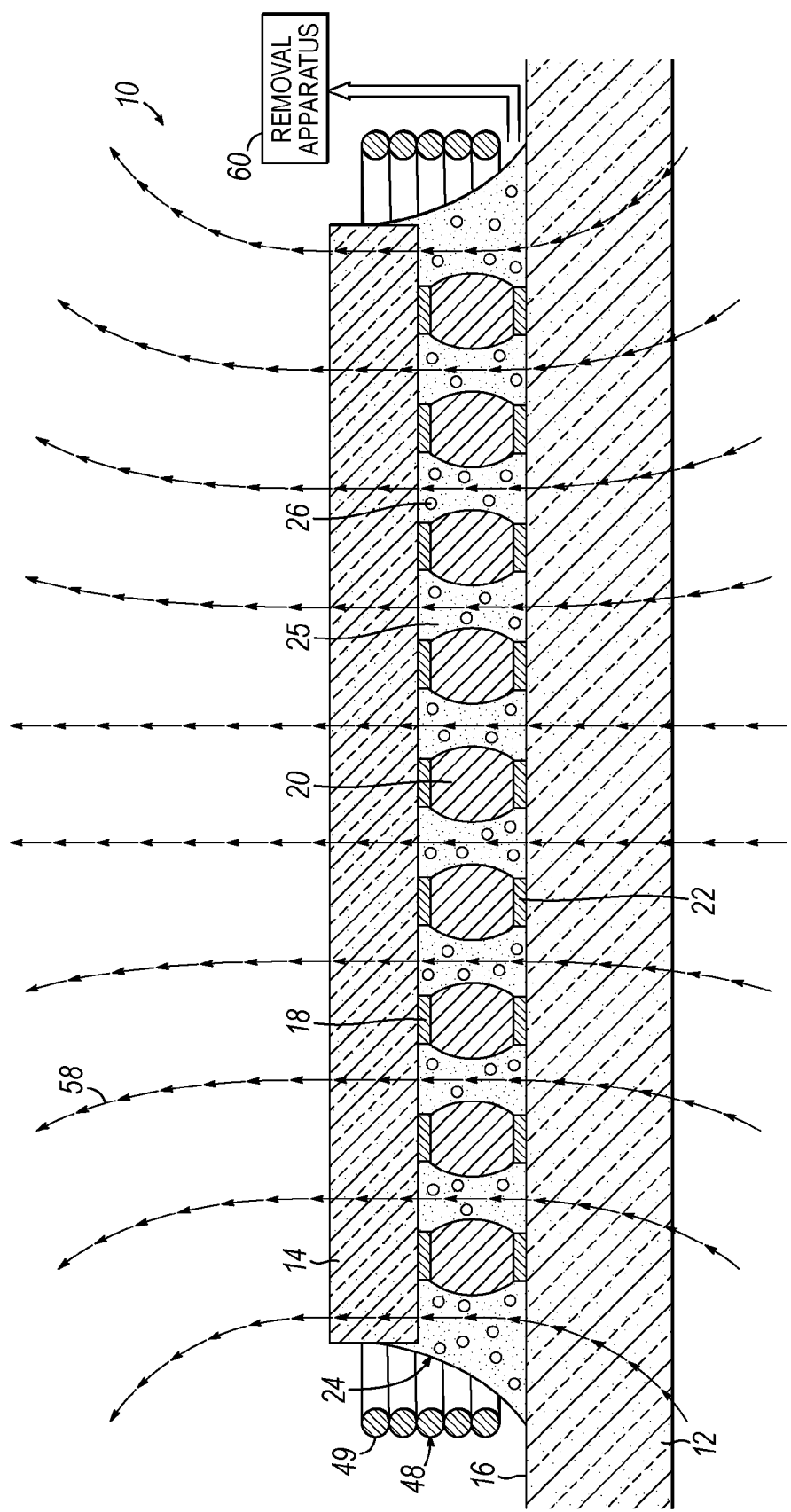
FIG. 3 is a side view similar to FIG. 1 in which the underfill material is in the process of being removed from the space between the chip and the substrate with the assistance of induction heating through the operation of the system of FIG. 2.

With reference to FIGS. 2, 3 and in accordance with an embodiment of the invention, a system 30 is shown that is configured to use induction heating to cause the underfill material 24 to heat through the heating of the particles 26 and experience a temperature rise. The system 30 includes a controller 32 with at least one processor 34 including at least one hardware-based microprocessor and a memory 36 coupled to the at least one processor 34. The memory 36 may represent the random access memory (RAM) devices comprising the main storage of controller 32, as well as any supplemental levels of memory, e.g., cache memories, non-volatile or backup memories (e.g., programmable or flash memories), read-only memories, etc. In addition, memory 36 may be considered to include memory storage physically located elsewhere in the controller 32, e.g., any cache memory in a microprocessor, as well as any storage capacity used as a virtual memory, e.g., as stored on a mass storage device or on another computer coupled to the controller 32.

For interfacing with a user or operator, the controller 32 may include a user interface 38 incorporating one or more user input/output devices, e.g., a keyboard, a pointing device, a display, a printer, etc. Otherwise, input may be received via another computer or terminal over a network interface 40 coupled to a communication network. The controller 32 also may be in communication with one or more mass storage devices, which may be, for example, internal hard disk storage devices, external hard disk storage devices, external databases, storage area network devices, etc.

The controller 32 typically operates under the control of an operating system 42 and executes or otherwise relies upon various computer software applications, components, programs, objects, modules, engines, data structures, etc., including for example, a heater control module 44 and a removal control module 45. The heater control module 44 may be configured to control the operation of a power supply 46 when its instructions are executed by the at least one processor 34 of the controller 32 in order to power an induction heater 48 that causes the underfill material 24 to be heated and experience a temperature rise above its initial temperature (e.g., room temperature). The controller 32 may include a power supply interface 50 that couples the controller 32 with the power supply 46. The removal control module 45 may be configured to control the operation of a removal apparatus 60 when its instructions are executed by the at least one processor 34 of the controller 32 in order to operate a removal apparatus 60 that is configured to remove the underfill material 24. The underfill material 24 may be removed either during heating of the underfill material 24 by the induction heater 48 or after heating of the underfill material 24 by the induction heater 48 while the underfill material 24 is in a condition (i.e., a liquid phase or a semisolid state) suitable for removal. The controller 32 may include a removal apparatus interface 56 that couples the controller 32 with the removal apparatus 60.

Moreover, various applications, components, programs, objects, modules, etc. may also execute on one or more processors in another computer coupled to the controller 32 via the communication network, e.g., in a distributed or client-server computing environment, whereby the processing required to implement the functions of a computer program may be allocated to multiple computers over a network. The memory 36 may store one or more data structures including, for example, a database 52 configured with records 54 to store data relating to the process (e.g., control settings for the power supply 46, control settings for the removal apparatus, etc.).

As best shown in FIG. 3, the induction heater 48 is located proximate to the assembly 10 at the time of use to remove the underfill material 24 from beneath the chip 14 in connection with reworking the chip 14. In a representative embodiment, the induction heater 48 may comprise an induction coil 49 consisting of multiple turns of a helically-wound conductor. The time-varying magnetic field, as indicated diagrammatically by the field lines 58, is formed in and around the turns of the induction coil 49, when circulating a time-varying electrical current through the induction coil 49, consistent with the Biot-Savart law. The strength of the magnetic field generated by the induction heater 48 varies with distance from the induction coil 49 and may be on the order of one (1) Tesla, although other field strengths may be applicable.

The induction coil 49 of the induction heater 48 is coupled by, for example, a high voltage cable with the power supply 46, which in turn is in communication with the controller 32 through the power supply interface 50. Time-varying electrical power is supplied from the power supply 46 to the induction coil 49 of the induction heater 48 in response to program code executed by the at least one processor 34, user interaction with the user interface 38, and/or other instructions or input received by the at least one processor 34. The power supply 46 may supply high-frequency alternating current to the induction heater 48. In one embodiment, the alternating current may be supplied to the induction heater 48 at a high frequency, such as at a radio frequency (e.g., 13.6 MHz). The frequency of the alternating current generating the magnetic field and the size of the particles 26 may be varied, among other factors, to modify the specific characteristics of the heating.

The assembly 10 can be positioned relative to the induction heater 48 such that the underfill material 24 between the substrate 12 and chip 14 is subjected to and influenced by the time-varying magnetic field 58 emanating from the induction coil 49. The induction coil 49 of the induction heater 48 may be dimensioned to receive the chip 14 inside its inner diameter. In a representative embodiment, the induction coil 49 of the induction heater 48 may have an inner diameter on the order of two (2) inches to three (3) inches with four (4) to five (5) turns and may be cooled by a cooling medium flowing through a lumen of the induction coil 49. Contact is not required between the chip 14 and the induction coil 49.

The removal apparatus 60 of the system 30 is configured to remove the underfill material 24, once converted to a liquid phase or semisolid state, from beneath the chip 14. The removal apparatus 60 may be configured to direct pressured gas or air (e.g., air jets) at, for example, one or more side edges of the chip 14 and thereby generate a removal force to displace the liquefied underfill material toward opposite side edges of the chip 14. The pressured gas or air may be maintained until the space beneath the chip 14 is effectively cleared of the underfill material 24. Alternatively, the removal apparatus 60 may be configured to apply suction at one or more side edges of the chip 14 and thereby generate a removal force to displace the underfill material 24 toward those side edges. The applied suction may be maintained until the space beneath the chip 14 is effectively cleared of the underfill material 24.

In use and with reference to FIGS. 1-3, the assembly 10 and the induction heater 48 are arranged such that the cured underfill material 24 can be exposed to the time-varying magnetic field generated by current flowing through the induction heater 48. In one embodiment, the induction coil 49 is placed around the chip 14 to provide a surrounding arrangement. The controller 32 then energizes (or is caused to energize) the induction heater 48 by causing the power supply 46 to supply a time-varying electrical current to the induction coil 49 of the induction heater 48. The time-varying electrical current in the induction coil 49 produces a time-varying magnetic field in the space in and about the induction coil 49 of the induction heater 48. At any given point in space near the chip 14, the magnetic field may be specified by a direction and a magnitude (or strength).

The time variation of the magnetic field induces eddy currents and/or magnetic hysteresis losses by electromagnetic induction in the material comprising the particles 26. Due to the electrical resistance of the material, the electrical currents generate heat by Joule heating and the temperature of the particles 26 rises. Heat energy is transferred outward from the heated particles 26 by thermal conduction into the surrounding cured bulk matrix 25 comprising the underfill material 24.

The heating time and parameters for the high-frequency alternating current supplied to the induction heater 48 are selected to transform the cured bulk matrix 25 from the solid phase to a liquid phase or semisolid state. Specifically, the cured bulk matrix 25 may be heated by the transferred heat energy to a temperature that is greater than or equal to a liquefaction point. The specific liquefaction point is contingent, among other factors, upon the composition of the cured bulk matrix 25. The heating time required to liquefy the cured bulk matrix 25 may be on the order of tens to hundreds of microseconds. During the operation of the induction heater 48, the heating of the chip 14 and the substrate 12 may be negligible.

While the bulk matrix 25 of the underfill material 24 is liquefied by a phase transformation from its cured solid phase to a liquid phase or a semifluid state, the removal apparatus 60 is operated to remove the underfill material 24 from beneath the chip 14. After the underfill material 24 is removed, still liquefied in advance of removal, or in the process of being removed, the controller 32 may operate the power supply 46 to discontinue the time-varying current in the induction coil 49 of the induction heater 48, and thereby discontinue the application of the time-varying magnetic field. After the underfill material 24 is removed, the chip 14 may be removed or separated from the substrate 12 in a subsequent step that involves liquefying the solder bumps 20, for example, in a reflow oven or with heated air jets.

In an alternative embodiment, the solder bumps 20 on the chip 14 may be heated by the heat energy generated from the particles 26 in the underfill material 24 to a temperature that is greater than the melting point of the constituent solder material, which liquefies the solder bumps 20. Specifically, heat energy is transferred outward from the cured bulk matrix 25 of the underfill material 24 by thermal conduction to the solder bumps 20. The degree of heating may be controlled through, among other factors, selection of the properties on the particles 26 and the strength of the magnetic field. While the underfill material 24 and the solder bumps 20 are both in the liquefied state, the chip 14 is separated from the substrate 12.

The cured bulk matrix 25 of the underfill material 24 and the solder bumps 20 each possess a given melting temperature. Though a selection of the constituent materials, the bulk matrix 25 of the underfill material 24 may be caused to liquefy and transform to the liquid phase or semisolid state prior to the liquefaction of the solder bumps 20 (i.e., the melting temperature of the bulk matrix 25 is less than the melting temperature of the solder bumps 20). Alternatively, the bulk matrix 25 of the underfill material 24 may be caused to liquefy after the liquefaction of the solder bumps 20 (i.e., the melting temperature of the bulk matrix 25 is greater than the melting temperature of the solder bumps 20).

Removing the underfill material 24 using induction heating may reduce the impact of the heating on the material constituting the substrate 12. For example, the use of induction heating may eliminate wear-out mechanisms associated with the exposure of certain type of substrates 12, such as plastic laminates, to an excessive number of heat cycles. These wear-out mechanisms may limit the number of permitted reworks of the solder bumps 20.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for removing an underfill material from beneath a chip, the method comprising:
   heating the underfill material with induction heating; and
   while the underfill material is heated, removing the underfill material from beneath the chip.

2. The method of claim 1 wherein heating the underfill material comprises:
   coupling a time-varying magnetic field with a plurality of particles in the underfill material to heat the particles; and
   transferring heat energy from the particles to a bulk matrix of the underfill material.

3. The method of claim 2 wherein the particles are comprised of a ferromagnetic material, and the time-varying magnetic field induces eddy currents in the ferromagnetic material of the particles to produce the heat energy.

4. The method of claim 2 wherein the particles are comprised of a ferriceramic material, and the time-varying magnetic field induces magnetic hysteresis losses in the ferriceramic material of the particles to produce the heat energy.

5. The method of claim 2 wherein coupling the time-varying magnetic field with the particles in the underfill material comprises:

passing an electrical current through an induction coil to generate the time-varying magnetic field.

6. The method of claim 1 wherein the underfill material includes a bulk matrix that is transformed from a solid phase to a liquid phase or a semisolid state by the induction heating, and the underfill material is removed while the underfill material is in the liquid phase or in the semisolid state.

7. The method of claim 6 wherein a plurality of first pads on the chip are coupled by a plurality of solder bumps with a plurality of second pads on a substrate, and the bulk matrix of the underfill material transforms from the solid phase to the liquid phase or the semisolid state at a first temperature less than a second temperature at which the solder bumps liquefy.

8. A method for reworking a chip, the method comprising:
heating an underfill material between the chip and a substrate with induction heating;
heating a plurality of solder bumps coupling a plurality of first pads on the chip with a plurality of second pads on the substrate; and
while the underfill material and the solder bumps are heated, removing the chip from the substrate.

9. The method of claim 8 wherein heating the underfill material comprises:
coupling a time-varying magnetic field with a plurality of particles in the underfill material to heat the particles; and
transferring heat energy from the particles to a bulk matrix of the underfill material.

10. The method of claim 9 wherein heating the solder bumps further comprises:
transferring the heat energy from the bulk matrix of the underfill material to the solder bumps.

11. The method of claim 9 wherein the particles are comprised of a ferromagnetic material, and the time-varying magnetic field induces eddy currents in the ferromagnetic material of the particles to produce the heat energy.

12. The method of claim 9 wherein the particles are comprised of a ferriceramic material, and the time-varying magnetic field induces magnetic hysteresis losses in the ferriceramic material of the particles to produce the heat energy.

13. The method of claim 9 wherein coupling the time-varying magnetic field with the particles in the underfill material comprises:
passing an electrical current through an induction coil to generate the time-varying magnetic field.

14. The method of claim 8 wherein the underfill material includes a bulk matrix that is transformed by the induction heating from a solid phase to a liquid phase or a semisolid state at a first temperature, the solder bumps are liquefied by the heating at a second temperature, and the chip is removed from the substrate while the underfill material is in the liquid phase or in the semisolid state and the solder bumps are liquefied.

15. The method of claim 14 wherein the first temperature less than the second temperature.

16. The method of claim 14 wherein the first temperature is greater than the second temperature.

* * * * *